United States Patent [19]

Mizushima

[11] Patent Number: 5,717,627
[45] Date of Patent: Feb. 10, 1998

[54] OPTICAL MEMORY DEVICE INCORPORATING PHOTODETECTOR DEVICES AND LIGHT EMITTING DEVICES

[75] Inventor: Yoshihiko Mizushima, Hamamatsu, Japan

[73] Assignee: Hamamatsu Photonics K.K., Hamamatsu, Japan

[21] Appl. No.: 790,790

[22] Filed: Jan. 30, 1997

[30] Foreign Application Priority Data

Feb. 2, 1996 [JP] Japan .................. 8-017728

[51] Int. Cl.$^6$ .................. G11C 11/42; G01J 1/32; H01J 40/14
[52] U.S. Cl. .................. 365/112; 365/115; 365/175; 250/205; 250/214 LS
[58] Field of Search .................. 365/112, 115, 365/159, 175; 250/205, 214 LS

[56] References Cited

U.S. PATENT DOCUMENTS

| | | | |
|---|---|---|---|
| 4,074,143 | 2/1978 | Rokos | 250/552 |
| 4,521,681 | 6/1985 | Inaba et al. | 250/205 |
| 5,059,788 | 10/1991 | Tashiro et al. | 250/214 LS |
| 5,109,358 | 4/1992 | Mizushima et al. | 365/154 |

OTHER PUBLICATIONS

Physical Review Letters, vol. 69, No. 12, Sep. 21, 1992 "Quantum Noise–Correlated Operation of Electrically Coupled Semiconductor Light Emitters" P.J. Edwards et al, pp. 1757–1760.

Electronics Letters 4th. Feb. 1993, vol. 29, No. 3, "Low–Noise Optoelectronic Amplifier Using Sub–Shot Noise Light" pp. 299–301, P.J. Edwards.

Advanced Telecommunications Research Centre, Annual Report 1994, Faculty of Information Sciences and Engineering, pp. 1–26.

*Primary Examiner*—David C. Nelms
*Assistant Examiner*—Andrew Q. Tran
*Attorney, Agent, or Firm*—Cushman Darby & Cushman IP Group of Pillsbury Madison & Sutro LLP

[57] ABSTRACT

The optical memory device of the present invention comprises a photodetector device which generates a current when light is incident thereon and a light-emitting device which is connected to the photodetector device in series so as to emit light upon receiving a supply of current from the photodetector device and feed back thus emitted light toward the photodetector device.

3 Claims, 2 Drawing Sheets

OPTICAL MEMORY DEVICE INCORPORATING PHOTODETECTOR DEVICES AND LIGHT EMITTING DEVICES

BACKGROUND OF THE INVENTION

1. Field of the Invention

The present invention relates to an optical memory device.

2. Related Background Art

There are various kinds of prior art concerning optical memory devices. As such optical memory devices, there have been known, for example, those utilizing a nonlinear characteristic of a laser diode to generate hysteresis and those used in combination with a transistor to utilize a nonlinear characteristic of the latter. Among these optical memory devices, important in practice are those which can be integrated as a photoelectric integrated circuit and can be used for optical arithmetic operation. Namely, the existence of semiconductors such as RAM in LSI is necessary and indispensable, and increase in memory capacity and higher processing speed have recently been in demand, thereby perpetually requiring minute processing technology. Accordingly, development of optical memory devices for satisfying such demand has been desired.

SUMMARY OF THE INVENTION

In the conventional optical memory devices, however, no equivalent for semiconductor memory exists. Namely, since the conventional optical memory devices have a high power consumption per bit and occupy a large area, they have not yet been integrated as an integrated circuit. For example, while the mean power consumption of a semiconductor memory device is about 0.1 µW, a semiconductor laser device currently requires a power consumption of about 10 mW.

Accordingly, the present invention provides a composite type optical memory device comprising a photodetector device which generates a current when light is incident thereon, and a light-emitting device which is connected to the photodetector device in series so as to emit light when the current is supplied thereto from the photodetector device and feed back thus emitted light toward the photodetector device, in which an external resistance greater than an internal resistance of the light-emitting device is equivalently provided as viewed from the light-emitting device, and an external resistance sufficiently greater than an internal resistance of the photodetector device is provided as viewed from the photodetector device.

In accordance with this aspect of the present invention, as the photodetector device is irradiated with incident light (set light) from the outside, a current is supplied from the photodetector device to the light-emitting device. Upon receiving this supply of current, the light-emitting device emits light. Thus emitted light forms output light, while a part thereof is fed back toward the photodetector device and made incident thereon. Accordingly, while receiving the light from the light-emitting device, the photodetector device keeps supplying the current to the light-emitting device. Therefore, even when the irradiation with set light is stopped, the light-emitting state of the light-emitting device is maintained such that the optical memory device functions as a storage device without using any active element other than the photodetector device and light-emitting device.

Also, in accordance with the present invention, the above-mentioned optical memory device may comprise a first external resistor which equivalently has a resistance value greater than the internal resistance of the photodetector device and is connected to the photodetector device in series, and a second external resistor which has a resistance value greater than the internal resistance of the light-emitting device and is connected to the light-emitting device in series. In accordance with this aspect of the present invention, the current flowing through the photodetector device is restricted by the first external resistor, while the current flowing through the light-emitting device is restricted by the second external resistor. Therefore, a light-emitting and light-receiving system which can be activated under a minute optical power is constituted by the light-emitting device and the photodetector device.

Also, the optical memory device of the present invention may further comprise a photodetector device for extinguishing the above-mentioned light-emitting device disposed in parallel thereto. In accordance with this aspect of the present invention, as this extinguishing photodetector device is irradiated with reset light, the light-emitting device which is emitting light can be extinguished.

Further, in the optical memory device of the present invention, a plurality of photodetector devices may be disposed in parallel, and a plurality of light-emitting devices may be disposed in series. In accordance with this aspect of the present invention, the optical output current supplied from the photodetector device becomes greater, while the intensity of light emitted from the light-emitting device with respect to the same current increases. Therefore, the quantum efficiency of internal light feedback in the light-receiving and light-emitting system improves, such that the light-emitting state of the light-emitting device can be securely maintained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
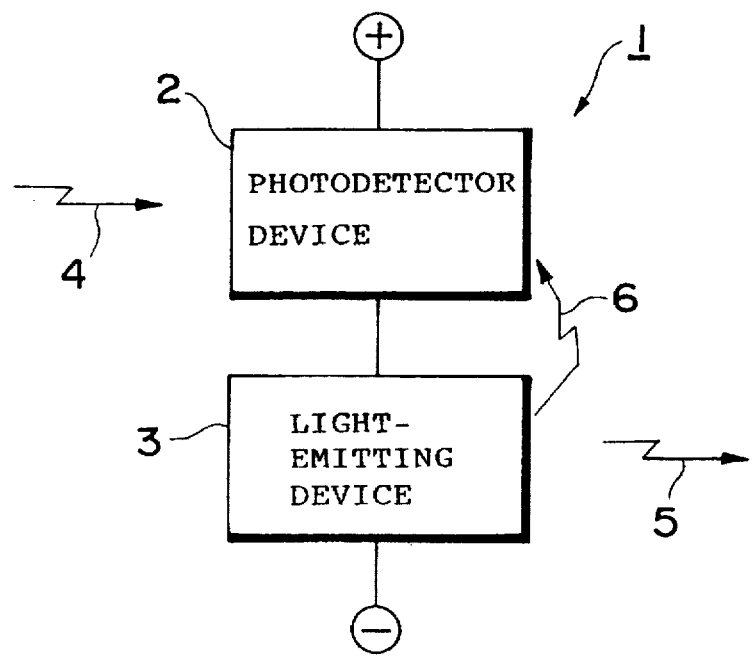
FIG. 1 is a schematic view of an optical memory device.

In the following, various kinds of embodiments of the optical memory device in accordance with the present invention will be explained with reference to the attached drawings. Here, constituents identical to each other in the drawings will be referred to with marks identical to each other, without their overlapping explanations repeated.

(Embodiment 1)

FIG. 1 is a schematic view of an optical memory device 1. In FIG. 1, the optical memory device 1 comprises a photodetector device 2 and a light-emitting device 3 connected to each other in series, and is configured such that a current is caused to flow through the light-emitting device 3 by way of the photodetector device 2. The photodetector device 2 is a device which generates a current upon receiving light, namely, when irradiated with light in the state where a predetermined voltage is applied thereto, it generates a current. The light-emitting device 3, by contrast, is a device which emits light when a current flows therethrough. The photodetector device 2 and the light-emitting device 3 are disposed such that light emitted from the light-emitting device 3 is fed back to and made incident on the photodetector device 2. Namely, when the light-emitting device 3 emits light, thus emitted light is made incident, by way of a predetermined feedback means, on the photodetector device 2, which thereby generates current. Though optical fiber, mirror, and the like can be used as the feedback means for the light, it is desirable that the photodetector device 2 and the light-emitting device 3 be disposed close to each other within an optical integrated circuit so as to make the light of the light-emitting device 3 directly incident on the photodetector device 2. Also, for example, an in-chip light waveguide may be used as the feedback means so as to guide light therethrough, thereby realizing an integrated circuit. The photodetector device 2 and the light-emitting device 3 may not be continuously connected to each other as shown in FIG. 1 as long as they are configured such that the current flowing out of the photodetector device 2 flows into the light-emitting device 3.

In this optical memory device 1, once the photodetector device 2 is irradiated with set light 4, the light-emitting state of the light-emitting device 3 is maintained even when the irradiation is interrupted. Namely, as shown in FIG. 1, in the state where a voltage is applied to both ends of a unit made of the photodetector device 2 and the light-emitting device 3, when the photodetector device 2 is irradiated with the set light 4, the current flowing through the photodetector device 2 increases. This increment in current flows from the photodetector device 2 into the light-emitting device 3, so that the latter emits light upon this supply of the current. While the light emitted from the light-emitting device 3 becomes output light 5 of the optical memory device 1, a part thereof is fed back and made incident on the photodetector device 2 as feedback light 6. Upon receiving the feedback light 6, the photodetector device 2 keeps supplying a current to the light-emitting device 3. Accordingly, even when the set light 4 stops irradiating the photodetector device 2, the light-emitting state of the light-emitting device 3 is maintained by the continuous supply of current from the photodetector device 2. When the light-emitting device 3 is to be extinguished from this state, an extinguishing means for temporarily lowering the potential between the photodetector device 2 and the light-emitting device 3 is provided. Thus, as the set light 4 is input, the extinction state and light-emitting state of the light-emitting device 3 can be arbitrarily controlled. Accordingly, as light is input, one bit of data can be stored through extinction and emission of light in the light-emitting device 3, and such data can be output by light. Thus, the optical memory device 1 can be regarded as an optical flip-flop circuit, which corresponds to RAM, flush memory, or the like in LSI.

Here, in this optical memory device 1, in order for the light-emitting device 3 to continuously emit light upon irradiation of the photodetector device 2 with the set light 4, the optical feedback from the light-emitting device 3 to the photodetector device 2 must have a loop gain of 1 or greater. The photodetector device may be formed as an avalanche multiplying device, or a multiplier may be incorporated therein. Also, in the present invention, multiplication effected by photoconductive detection can be effectively utilized in particular.

Also, in the optical memory device 1, when a stationary negative resistance is generated between the light input and light output in the optical feedback from the light-emitting device 3 to the photodetector device 2 so as to set an appropriate bias in the photodetector device 2 and the light-emitting device 3, the loop gain can be made 1 or greater. As optical feedback between the light input and light output in which a stationary negative resistance is utilized to attain a loop gain of 1 or greater, that disclosed in P. J. Edwards, et al., *Annual Report*, ATRC Univ. of Canberra, 1994, p. 9 has been known. This publication, however, does not relate to optical memory devices but to a relaxation oscillator.

Figure 2:
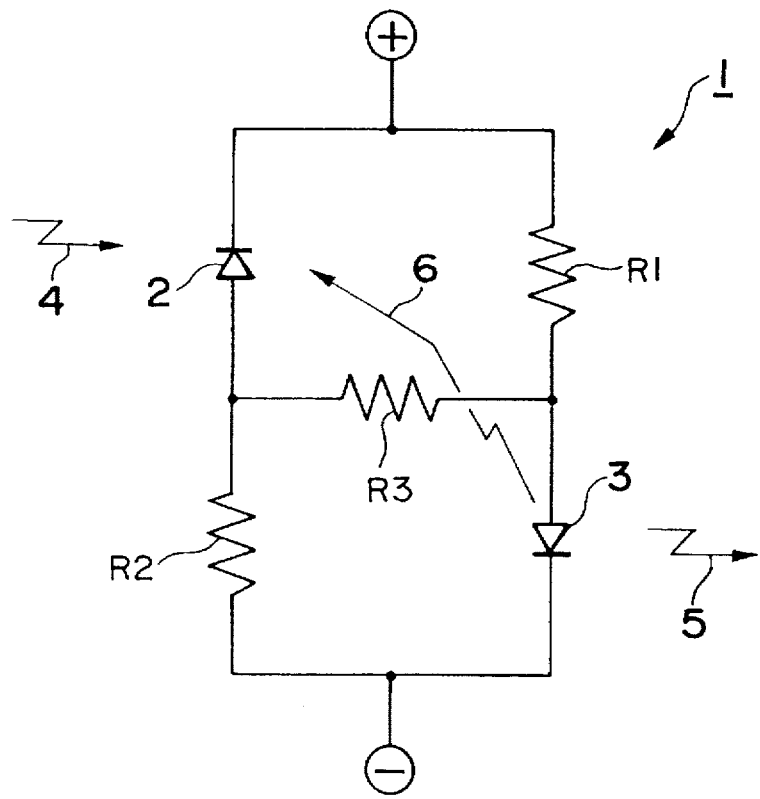
FIG. 2 is an explanatory view of an optical memory device in accordance with Embodiment 1.

In the following, a specific configurational example of the optical memory device 1 will be explained. As shown in FIG. 2, in the optical memory device 1, wired in parallel are a unit in which the photodetector device 2 and a resistor R2 are connected to each other in series and a unit in which a resistor R1 and the light-emitting device 3 are connected to each other in series, while a resistor R3 is connected to between the photodetector device 2 and the resistor R2 as well as between the resistor R1 and the light-emitting device 3. It is a lattice type bridge configuration, in which a non-equilibrium differential current is generated at the time when it is switched on and off.

As the light-emitting device 3, which outputs light when a current flows therethrough, adopted is a resistor which emits light under a minute current such as light-emitting diode. Of course, other means such as laser diode may be used as long as they emit light under a minute current. While the light-emitting device 3 is an output means in the optical memory device 1, it has a function of feeding back a part of its output light to the photodetector device 3 so as to irradiate the latter. Also, connected to the light-emitting device 3 in series is the resistor R1, which limits the current flowing into the light-emitting device 3. Used as the resistor R1 is a resistor having a resistance value greater or, preferably, sufficiently greater than the internal resistance of the light-emitting device 3 as viewed from the light-emitting device 3. When a high resistance such as the resistor R1 is connected to a current supplying path of the light-emitting device 3, a minute constant current is supplied to the light-emitting device 3, whereby the light-emitting device 3 emits light in a sub-Poisson state. Namely, when the resistor R1 connected to the light-emitting device 3 in series has a resistance value sufficiently higher than the internal resistance of the latter, the constant current determined by the resistance value of the resistor R1 flows through the circuit, whereby the light-emitting device 3 emits light having less noise such as fluctuation.

The photodetector device 2, on the other hand, generates a current upon irradiation with light and supplies the current to the light-emitting device 3. For example, a counter-biased p-n junction diode may be used. While the counter-biased p-n junction diode can lower the dark current obtained when not irradiated with light, there is a case where it is inappropriate for realizing a low-noise squeeze quantum distribution. Namely, noise such as fluctuation may occur in the current generated upon irradiation with light. Therefore, a photoconductive device may be used as the photodetector device 2. Since an ohmic contact electrode is used therein, it is not necessary for this photodetector device to be used in a counter-bias state. It is suitable for the aimed use since the internal resistance therein is low. This photoconductive device is advantageous in that, due to its low internal resistance, fluctuation noise in current can be suppressed when a high-impedance external resistor (resistor R2 or resistor R3) is connected thereto in series. Also, since the photoconductor device has a photoelectric multiplying characteristic therewithin, it yields a high output signal such that the quantum efficiency in photoelectric conversion apparently approximates 1 so as to reduce the above-mentioned fluctuation noise in current, thereby attaining lower noise. Here, any other known device can be used as the photodetector device 2 as long as it can supply a current to the light-emitting device 3 upon irradiation with light.

Figure 3:
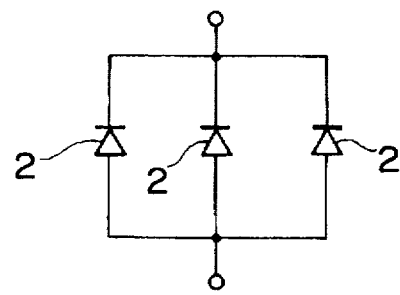
FIG. 3 is an explanatory view of a photodetector device.
Figure 4:
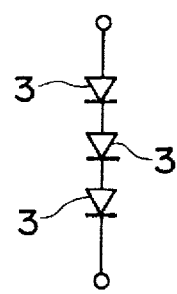
FIG. 4 is an explanatory view of a light-emitting device.

Also, as each of the resistors R2 and R3, a resistor having a resistance value greater than the internal resistance of the photodetector device 2 is used. Further, constants in the resistors R1 to R3 are appropriately set such that the loop gain in the optical feedback effected by the light-emitting device 3 and the photodetector device 2 becomes 1 or greater. Here, in order to increase the loop gain in optical feedback, a plurality of photodetector devices 2 may be disposed in parallel as shown in FIG. 3. Also, a plurality of light-emitting devices 3 may be disposed in series as shown in FIG. 4. When a plurality of photodetectors 2 and light-emitting devices 3 are used as shown in these drawings, the current supplied from the photodetector device 2 increases, while the intensity of light emitted from the light-emitting device 3 is enhanced. Accordingly, the quantum efficiency in optical feedback in the light-receiving and light-emitting system formed by the photodetector device 2 and the light-emitting device 3 improves, so that the light-emitting state of the light-emitting device can be securely maintained. Therefore, amplification can be attained between the photodetector device 2 and the light-emitting device 3 even when no electronic amplifier is used. In this case, unlike electronic systems, no noise is amplified.

As mentioned above, though examples in which a light-emitting device and a resistor are combined together have been known, there have been known no examples in which a photodetector device and a resistor are combined together so as to be used for detecting light. Of course, there have been no examples at all in which a resistor is incorporated in the combination of light-emitting device, photodetector device, extinguishing device, and the like.

As the light-emitting device 3 and the photodetector device 2 constitute a light-emitting and light-receiving system which operates under a minute optical power, the optical memory device 1 can have a low power consumption and occupy a small area, thereby realizing an integrated memory device.

(Embodiment 2)

Figure 5:
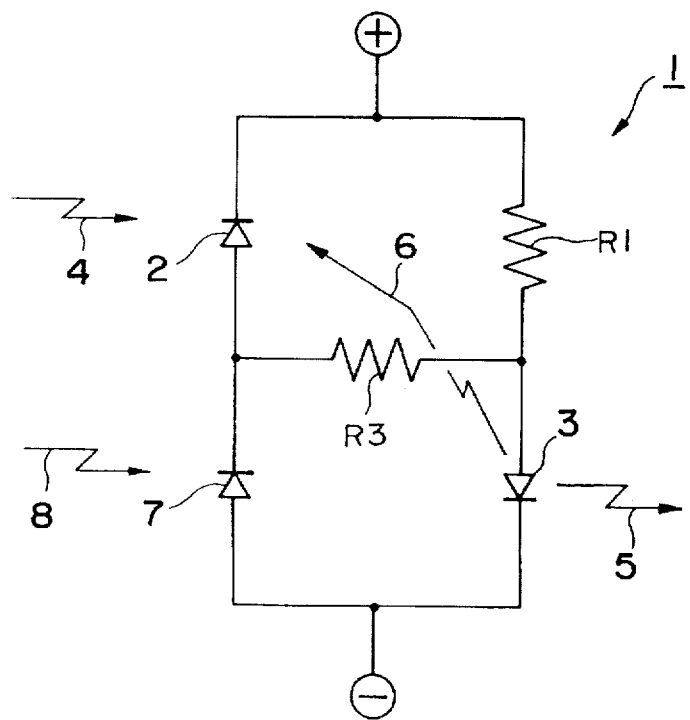
FIG. 5 is an explanatory view of an optical memory device in accordance with Embodiment 2.

In the following, another embodiment of the optical memory 1 will be explained. FIG. 5 shows a modification of the embodiment shown in FIG. 2. For example, in the optical memory device 1, wired in parallel are a unit in which the photodetector device 2 for light emission and a photodetector device 7 for extinction are connected to each other in series and a unit in which the resistor R1 and the light-emitting device 3 are connected to each other in series, while the resistor R3 is connected to between the photodetector devices 2 and 7 as well as between the resistor R1 and the light-emitting device 3. In this optical memory device 1, in the state where the light-emitting device 3 emits light as the photodetector device 2 is irradiated with the set light 4, when the extinguishing photodetector 7 is irradiated with reset light 8, the light-emitting device 3 is extinguished. Namely, when the extinguishing photodetector device 7 is irradiated with the reset light 8, a current flows through the photodetector device 7, such that the current supplied to the light-emitting device 3 serially connected to the photodetector device 7 temporarily decreases. Accordingly, the feedback light 6 from the light-emitting device 3 to the photodetector device 2 is extinguished, thereby stopping the supply of current from the photodetector device 2. Accordingly, the light-emitting device 2 changes from the light-emitting state to the extinction state, so that the output light 5 is turned off. Thus, in the optical memory device 1 having the extinguishing photodetector device 7, upon irradiation with the set light 4 or the reset light 8, the on and off states of the output light 5 can be arbitrarily controlled.

Namely, this optical memory device comprises the first photodetector device 2 to which the optical signal 4 is input; the light-emitting device 3 connected to the first photodetector device 2 in series, wherein the light-emitting device 3 is disposed such that the part 6 of the light from the light-emitting device 3 is fed back to the first photodetector device 2; the first resistor R1 connected to the first photodetector 2 in parallel and connected to the light-emitting device 3 in series, wherein the first resistor R1 has a resistance value greater than the internal resistance of the light-emitting device 3, wherein, when the optical signal 4 is input to the first photodetector device 2, a current from the first photodetector device 2 and a constant current from the first resistor R1 are supplied to the light-emitting device 3, and wherein the constant current from the first resistor R1 is sufficiently lower than the current from the first photodetector device 2 so as to allow the light-emitting device 3 to emit light in a sub-Poisson state; the second resistor R3 connected to between the first photodetector device 2 and the light-emitting device 3, wherein the second resistor R3 has a resistance value greater than the internal resistance of the first photodetector device 2; and the second photodetector device 7 connected to the first photodetector device 2 in series and connected to the light-emitting device 3 in parallel, wherein, when the second photodetector device 7 is irradiated with the reset light 8 while the light-emitting device 3 emits light, the current flowing through the light-emitting device 3 decreases to extinguish the light-emitting device 3.

In the optical memory device 1 of FIG. 5, the photodetector devices 2 and 7 may form a unitary element instead of being provided separately. Namely, as the photodetector devices 2 and 7, a three-terminal device having a connection terminal to the light-emitting device 3 may be used.

As explained in the foregoing, the present invention can yield the following effects.

Namely, as light from the outside is input, the extinction state and light-emitting state of the light-emitting device can be controlled by way of the photodetector device. Accordingly, without the aid of active elements such as transistor other than the photodetector device and light-emitting device, the optical memory unit of the present invention can function as a memory device which operates upon input of light so as to output light. Therefore, unlike the conventional electronic memories, there are no obstacles in time constant caused by electrostatic capacity between wirings and the like, whereby operation speed can be made higher. Also, since the arithmetic logic of the optical memory device in accordance with the present invention is similar to that of the conventional electronic memory except that input and output are effected in terms of light, it can be used in place of the conventional electronic memory which constitutes a part of a computer.

Also, as external resistors having predetermined resistance values are respectively connected to the photodetector device and the light-emitting device in series, a light-emitting and light-receiving system which can be actuated under a minute optical power is constituted. Accordingly, power consumption at the time of actuation can be lowered so as to reduce the sizes of the photodetector device and light-emitting device. Therefore, it can be integrated as an optical memory. Also, as such external resistors are connected, noise in the light fed back in the light-emitting and light-receiving system can be reduced, whereby reliability in actuation can be improved.

Also, when a plurality of photodetectors are disposed in parallel while a plurality of light-emitting devices are disposed in parallel, the quantum efficiency in optical feedback in the light-receiving and light-emitting system formed by the photodetector device and light-emitting device can be improved, whereby the light-emitting state in the light-emitting device can be securely maintained.

Further, when an extinguishing photodetector device is disposed in parallel to the light-emitting device, upon input of light from the outside, the light-emitting state and the extinction state can be arbitrarily changed over therebetween. Accordingly, a memory device which maintains its storage state by input of light alone can be made.

As it can be seen from the fact that the optical memory device explained above operates while being restricted by the external resistance, it is suitable for operating in a minute optical power state. Consequently, the power consumption per memory is remarkably lowered as compared with that conventionally attained, so that the optical memory device can be integrated. Also, in order for the optical memory device to operate in a minute optical power, it must have a favorable noise resistance. As explained above, since the device operating under a high external resistance has less noise in its flowing current, it has been known that noise in the light emitted from the light-emitting device becomes lower than that in Poisson distribution. This is an important condition for manipulating very minute light and characterizes the present invention.

The feature noted above also applies to the noise in the photodetector device. It becomes one of important conditions for lowering noise by combining a light-emitting system and a light-receiving system together as in the case of the above-mentioned optical memory device 1, and characterizes the present invention.

As explained in the foregoing, while the conventional optical memory apparatus necessary for logical operation using light may not always be tolerable in practice, the present invention, for the first time, attains minute power and low noise. Its effects in the industry are enormous.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 17728/1996 filed on Feb. 2, 1996 is hereby incorporated by reference.

What is claimed is:

1. An optical memory device comprising:

a first photodetector device for receiving an optical signal;

a first light-emitting device, connected to said first photodetector device in series, for emitting light responsive to a current from said first photodetector device, said first light-emitting device being disposed such that a part of the light emitted therefrom is fed back to said first photodetector device;

a first device, connected to said first light-emitting device, having a resistance value higher than an internal resistance of said first light-emitting device;

a second device, connected to said first photodetector device, having a resistance value higher than an internal resistance of said first photodetector device a second photodetector device, connected to said first photodetector device in parallel; and a second light-emitting device connected to said first light-emitting device in series.

2. An optical memory device comprising:

a first photodetector device for receiving an optical signal;

a light-emitting device, connected to said first photodetector device in series, for emitting light responsive to a current from said first photodetector device, said light-emitting device being disposed such that a part of the light emitted therefrom is fed back to said first photodetector device;

a first device connected to said light-emitting device, said first device having a resistance value higher than an internal resistance of said light-emitting device;

a second device, connected to said first photodetector device, having a resistance value higher than an internal resistance of said first photodetector device; and a second photodetector device, connected to said light-emitting device in parallel and connected to said first photodetector device in series, wherein, when said second photodetector device is irradiated with reset light while said light-emitting device emits light, current flowing through said light-emitting device decreases to extinguish said light-emitting device.

3. An optical memory device comprising:

a first photodetector device to which an optical signal is input;

a light-emitting device connected to said first photodetector device in series, said light-emitting device being disposed such that a part of light emitted therefrom is fed back to said first photodetector device;

a first resistor connected to said first photodetector device in parallel and connected to said light-emitting device in series, said first resistor having a resistance value greater than an internal resistance of said light-emitting device, wherein, when said optical signal is input to said first photodetector device, a current from said first photodetector device and a constant current from said first resistor are supplied to said light-emitting device, and wherein the constant current from said first resistor is sufficiently lower than said current from said first photodetector device so as to allow said light-emitting device to emit light in a sub-Poisson state;

a second resistor connected between said first photodetector device and said light-emitting device, having a resistance value greater than an internal resistance of said first photodetector device; and a second photodetector device, connected to said first photodetector device in series and connected to said light-emitting device in parallel, wherein, when said second photodetector device is irradiated with reset light while said light-emitting device emits light, the current flowing through said light-emitting device decreases to extinguish said light-emitting device.

* * * * *